(12) United States Patent
Yang (10) Patent No.: US 8,796,790 B2
(45) Date of Patent: *Aug. 5, 2014

(54) METHOD AND STRUCTURE OF MONOLITHETICALLY INTEGRATED MICROMACHINED MICROPHONE USING IC FOUNDRY-COMPATIBLE PROCESSES

(75) Inventor: Xiao (Charles) Yang, Cupertino, CA (US)

(73) Assignee: mCube Inc., San Jose, CA (US)

( * ) Notice: Subject to any disclaimer, the term of this patent is extended or adjusted under 35 U.S.C. 154(b) by 492 days.

This patent is subject to a terminal disclaimer.

(21) Appl. No.: 12/490,292

(22) Filed: Jun. 23, 2009

(65) Prior Publication Data

US 2010/0164025 A1 Jul. 1, 2010

Related U.S. Application Data

(60) Provisional application No. 61/075,729, filed on Jun. 25, 2008.

(51) Int. Cl.
*H01L 29/84* (2006.01)

(52) U.S. Cl.
USPC .............................................. 257/416; 438/53

(58) Field of Classification Search
USPC ......... 257/416, E29.324; 438/50–53; 29/594; 333/186
See application file for complete search history.

(56) References Cited

U.S. PATENT DOCUMENTS

| | | | |
|---|---|---|---|
| 6,393,913 B1 | 5/2002 | Dyck et al. | |
| 7,536,769 B2 * | 5/2009 | Pedersen | 29/594 |
| 7,885,423 B2 * | 2/2011 | Weigold | 381/174 |
| 2009/0278217 A1 * | 11/2009 | Laming et al. | 257/419 |
| 2010/0164025 A1 | 7/2010 | Yang | |

OTHER PUBLICATIONS

Non-Final Office Action for U.S. Appl. No. 12/499,027, mailed on Jul. 11, 2012, 17 pages.
Non-Final Office Action for U.S. Appl. No. 12/499,027, mailed on Sep. 23, 2011, 22 pages.
Requirement for Restriction/Election for U.S. Appl. No. 12/499,027, mailed on May 24, 2011, 5 pages.

* cited by examiner

*Primary Examiner* — Shaun Campbell
(74) *Attorney, Agent, or Firm* — Kilpatrick Townsend & Stockton LLP

(57) ABSTRACT

A monolithically integrated MEMS and CMOS substrates provided by an IC-foundry compatible process. The CMOS substrate is completed first using standard IC processes. A diaphragm with stress relief corrugated structure is then fabricated on top of the CMOS. Air vent holes are then etched in the CMOS substrate. Finally, the microphone device is encapsulated by a thick insulating layer at the wafer level. The monolithically integrated microphone that adopts IC foundry-compatible processes yields the highest performance, smallest form factor, and lowest cost. Using this architecture and fabrication flow, it is feasible and cost-effective to make an array of Silicon microphones for noise cancellation, beam forming, better directionality and fidelity.

21 Claims, 8 Drawing Sheets

METHOD AND STRUCTURE OF MONOLITHETICALLY INTEGRATED MICROMACHINED MICROPHONE USING IC FOUNDRY-COMPATIABLE PROCESSES

CROSS-REFERENCES TO RELATED APPLICATIONS

This application claims priority to and benefit from U.S. Provisional Patent Application No. 61/075,729, filed Jun. 25, 2008 and commonly assigned, the disclosure of which is hereby incorporated herein by reference for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is related to microphone devices. More particularly, the present invention provides a method and device using integrated MEMS and circuits for a microphone application. Merely by way of example, the microphone can be applied to cellular phones, blue tooth applications, hearing aids, records, camcorders, cameras, or any other application that includes voice.

Conventional Electret Condenser Microphones (ECM) have been widely used in mobile phones and audio equipment. ECMs, however, have major limitations particularly in mobile electronics. That is, ECMs have large form factors. ECMs are also costly and difficult to manufacture efficiently. Besides the large size and high operating voltages, ECMs often cannot sustain typical surface mount temperature of ~260 Celsius. Accordingly, ECMs are often hand soldered, which leads to significant manufacturing costs and inefficiencies.

To overcome limitations of ECMs, silicon microphones have been proposed. Silicon microphones have advantages over conventional ECMs. That is, silicon microphones are generally fabricated in a similar ways to integrated circuits to significantly reduce its size and resulting form factor. It is also surface mountable using conventional pick and place methods for board level assembly. It has superior temperature and humidity performance, and lower power and potentially lower cost comparing to ECMs. Although silicon microphones have been successful, limitations still exist. The incumbent silicon microphone technologies are based on MEMS fabrication processes such as bulk and surface micromachining techniques. Accordingly, silicon microphones are still difficult to manufacture efficiently.

Thus, it is desirable to improve silicon microphones.

BRIEF SUMMARY OF THE INVENTION

The present invention relates to integrating a MEMS structure on top of a CMOS substrate monolithically using IC-foundry compatible processes. The CMOS substrate is completed first using standard IC processes. A diaphragm with stress relief corrugated structure is then fabricated on top of the CMOS. Air vent holes are then etched in the CMOS substrate. Finally, the microphone device is encapsulated by a thick insulating layer at the wafer level.

In a specific embodiment, the present invention provides a microphone device. The device has a substrate having a surface region and a CMOS integrated circuit device layer overlying the surface region of the substrate. The device also has a diaphragm device having one or more surface regions overlying the CMOS integrated circuit device layer. At least one or more spring devices are spatially disposed within a vicinity of the one or more surface regions of the diaphragm device. Each of the folded spring devices is operably coupled to the one or more surface regions of the diaphragm device.

In an alternative specific embodiment, the present invention provides a microphone device. The device has a substrate having a surface region and a CMOS integrated circuit device layer overlying the surface region of the substrate. The device also has a diaphragm device having one or more surface regions overlying the CMOS integrated circuit device layer. At least one or more spring devices are spatially disposed within a vicinity of the one or more surface regions of the diaphragm device. Each of the folded spring devices is operably coupled to the one or more surface regions of the diaphragm device. Two or more electrode devices is operably coupled to each of the one or more surface regions. At least one air channel is formed between the two or more electrode devices. Optionally, the device also has a housing member provided overlying the diaphragm device to form an air cavity region between the housing member and the diaphragm device. In a preferred embodiment, the housing member comprises one or more air openings to allow air to move between the air cavity and a region outside of the housing member.

In yet an alternative specific embodiment, the present invention provides a microphone device. The device has a substrate having a surface region and a CMOS integrated circuit device layer overlying the surface region of the substrate. The device also has a diaphragm device having one or more surface regions overlying the CMOS integrated circuit device layer. The device has at least one or more spring devices spatially disposed within a vicinity of the one or more surface regions of the diaphragm device. Each of the folded spring devices is operably coupled to the one or more surface regions of the diaphragm device. The device also has two or more electrode devices operably coupled to each of the one or more surface regions and at least one air channel formed between the two or more electrode devices. The device has a back cavity region in communication with the air channel formed between the two or more electrode devices. In a specific embodiment, the back cavity region is overlying the CMOS integrated circuit device layer and a housing member provided overlying the diaphragm device to form an air cavity region between the housing member and the diaphragm device. The housing member comprises one or more air openings to allow air to move between the air cavity and a region outside of the housing member.

Still further, the present invention provides a microphone device. The device has a substrate having a surface region and a bulk region and a CMOS integrated circuit device layer overlying the surface region of the substrate. The device also has a diaphragm device having one or more surface regions overlying the CMOS integrated circuit device layer. At least one or more spring devices is spatially disposed within a vicinity of the one or more surface regions of the diaphragm device. Each of the folded spring devices is operably coupled to the one or more surface regions of the diaphragm device. Two or more electrode devices is operably coupled to each of the one or more surface regions. At least one air channel is formed between the two or more electrode devices. The device also has a back cavity region in communication with the air channel formed between the two or more electrode devices, the back cavity region being within a portion of the bulk region. A housing member is provided overlying the diaphragm device to form an air cavity region between the housing member and the diaphragm device. In a specific embodiment, the housing member comprises one or more air openings to allow air to move between the air cavity and a region outside of the housing member.

Still further, the present invention provides a microphone device. The device has a substrate having a surface region and a bulk region and a CMOS integrated circuit device layer overlying the surface region of the substrate. The device also has a diaphragm device having one or more surface regions overlying the CMOS integrated circuit device layer. The diaphragm device is formed from a portion of a single crystal silicon material of a silicon on insulator substrate. The device also has two or more electrode devices operably coupled to each of the one or more surface regions. At least one air channel is formed between the two or more electrode devices. A back cavity region is in communication with the air channel formed between the two or more electrode devices. In a specific embodiment, the back cavity region is within a portion of the silicon on insulator substrate and a support structure is provided to maintain the diaphragm device. In a specific embodiment, the support structure comprises a sandwich structure including an annular portion of the silicon on insulator substrate joined to an annular portion of the CMOS integrated circuit device layer overlying an annular portion of the surface region of the substrate.

Using this architecture and fabrication flow, it is feasible and cost-effective to make an array of Silicon microphones for noise cancellation, beam forming, better directionality and fidelity.

DETAILED DESCRIPTION OF THE INVENTION

The present invention is related to microphone devices. More particularly, the present invention provides a method and device using integrated MEMS and circuits for a microphone application.

Figure 1:
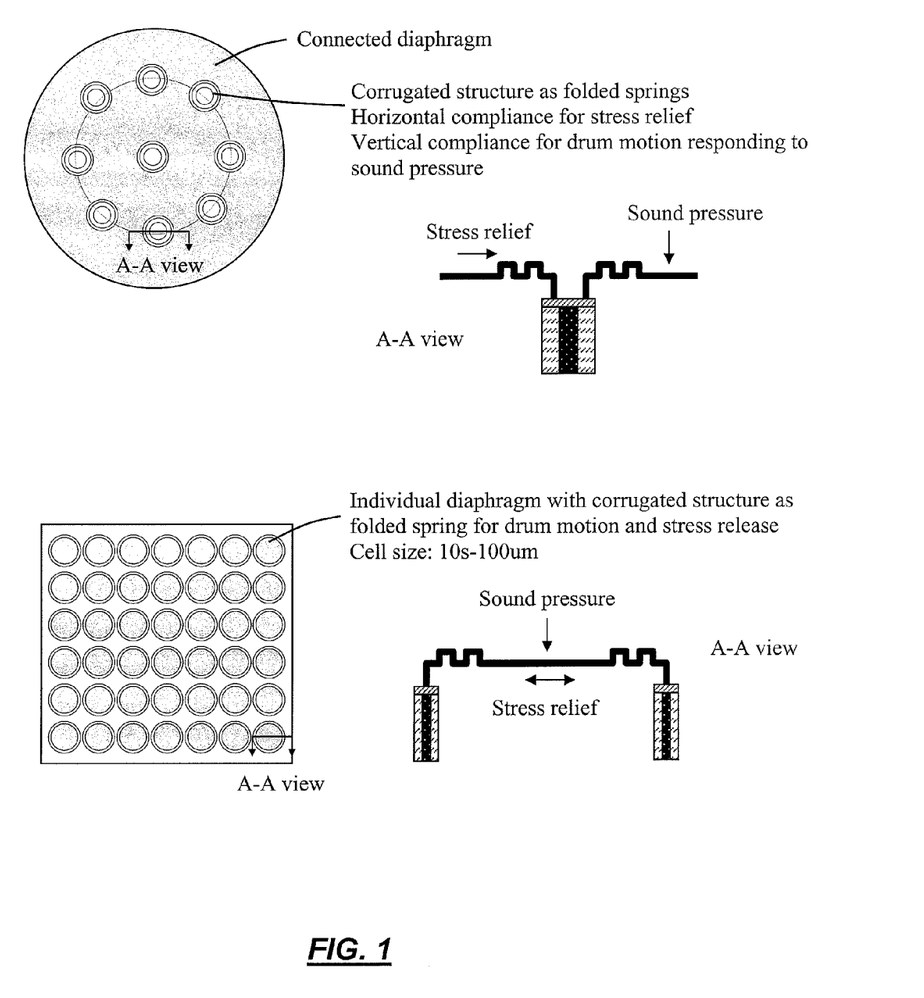
FIG. 1 is a simplified diagram of components of a micromachined microphone according to one embodiment of the present invention.

FIG. 1 is a simplified diagram of components of a micromachined microphone according to one embodiment of the present invention. As depicted, the diaphragm is either a continuous layer or an array of smaller diaphragm cells. To obtain high sensitivity of the microphone, a large and thin diaphragm is essential. It is, however, difficult to achieve due to intrinsic stress of the diaphragm film. As shown in the cross section view, a corrugated structure is adopted as folded springs. The folded spring has a horizontal compliance that is used for stress relief of the diaphragm film. The folder spring also has a vertical compliance that is used for drum motion responding to a sound pressure. In the continuous diaphragm configuration, the corrugated structures are evenly distributed with local supporting posts. In the array configuration, the diaphragm in each cell has corrugated structures at the edge and is anchored at the perimeter.

Figure 2:
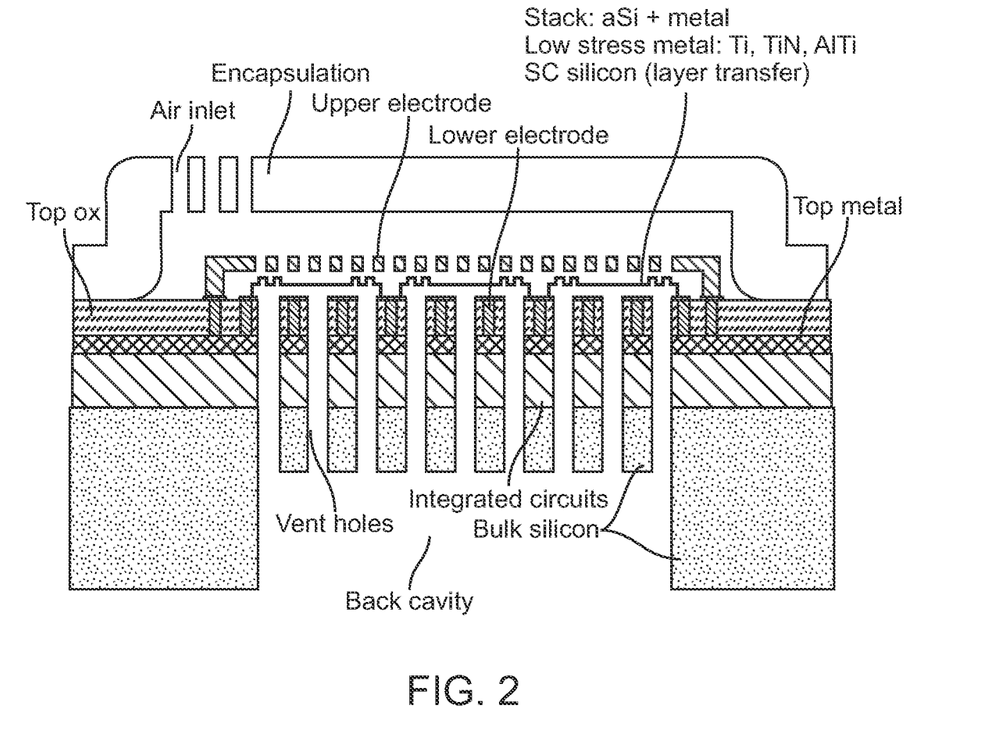
FIG. 2 is a simplified cross section diagram of components of a micromachined microphone according to one embodiment of the present invention.
Figure 3:
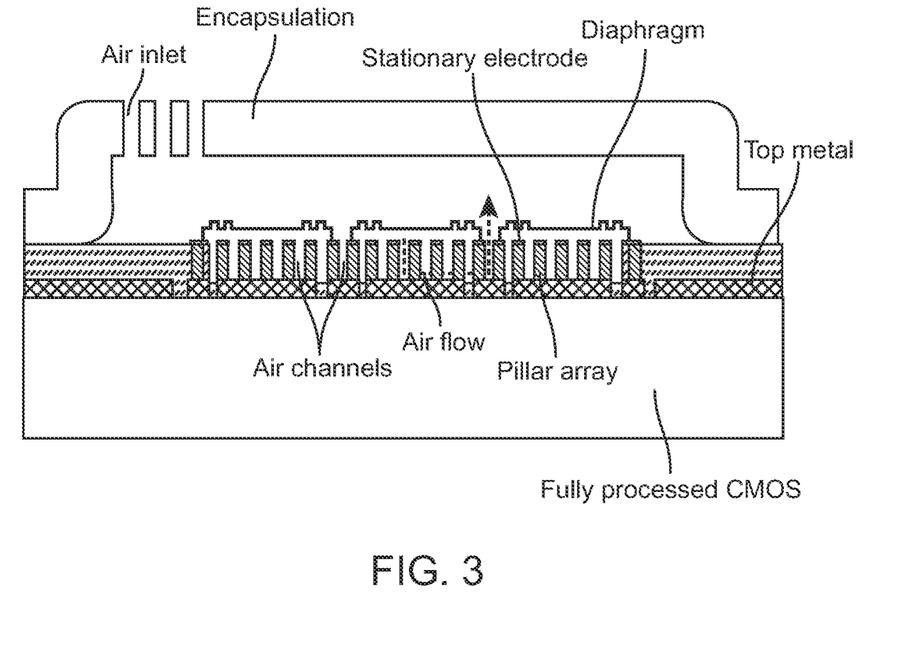
FIG. 3 is a simplified cross section diagram of components of a micromachined microphone according to one embodiment of the present invention.

FIG. 2 is a simplified cross section diagram of components of a micromachined microphone according to one embodiment of the present invention. As depicted, a diaphragm with corrugated springs is at top of a fully completed CMOS substrate. In one embodiment, the diaphragm is consisted with a stack of thin films such as amorphous Silicon and metal layers. In another embodiment, the diaphragm is a low stress metal thin film such as Ti, TiN, or AlTi alloy. In another embodiment, the diaphragm is a thin layer of single crystal silicon. Lower electrodes are formed at the top of the top oxide of the CMOS substrate to form a capacitor with the diaphragm. Optional upper electrodes can be formed on top of the diaphragm to form a differential output for increased sensitivity. Vent holes are etch through the CMOS layers and partial silicon substrate. The holes are connected by a back cavity formed in the CMOS silicon substrate. A thick layer of insulating material with air inlet holes is formed on top of the diaphragm to encapsulate the microphone. The fabrication flow of the microphone after CMOS include the following options:

1. Form diaphragm→form encapsulation→flip wafer→DIRE etch holes thru bulk Si, oxide, metal and stop on sacrificial organic material→DIRE etch back cavity→release diaphragm
2. Etch all oxide in CMOS layers with vent hole pattern→form diaphragm→form encapsulation→flip wafer→DIRE etch holes thru bulk Si, stop on sacrificial organic material→DIRE etch back cavity→release diaphragm
3. Etch all oxide in CMOS layers and partial silicon substrate with vent hole pattern form diaphragm→form encapsulation→flip wafer→DIRE etch back cavity→release diaphragm
4. Etch all oxide in CMOS layers and partial silicon substrate with vent hole pattern form diaphragm→form encapsulation→flip wafer→DIRE etch back cavity→release diaphragm
5. Etch all oxide in CMOS layers and partial silicon substrate with vent hole pattern→isotropic silicon etch to form back cavity→form diaphragm→form encapsulation →release diaphragm FIG. 3 is a simplified cross section diagram of components of a micromachined microphone according to one embodiment of the present invention. As depicted, the lower electrodes are an array of pillar structures which allow air to flow. The diaphragm is formed on top of the pillar electrodes with cavity underneath. Air outlet or vents are also formed in the diaphragm to allow the air vent to the front ambient eliminating the need of back cavity. The diaphragm can be either a continuous piece or an array of smaller diaphragm cells.

Figure 4:
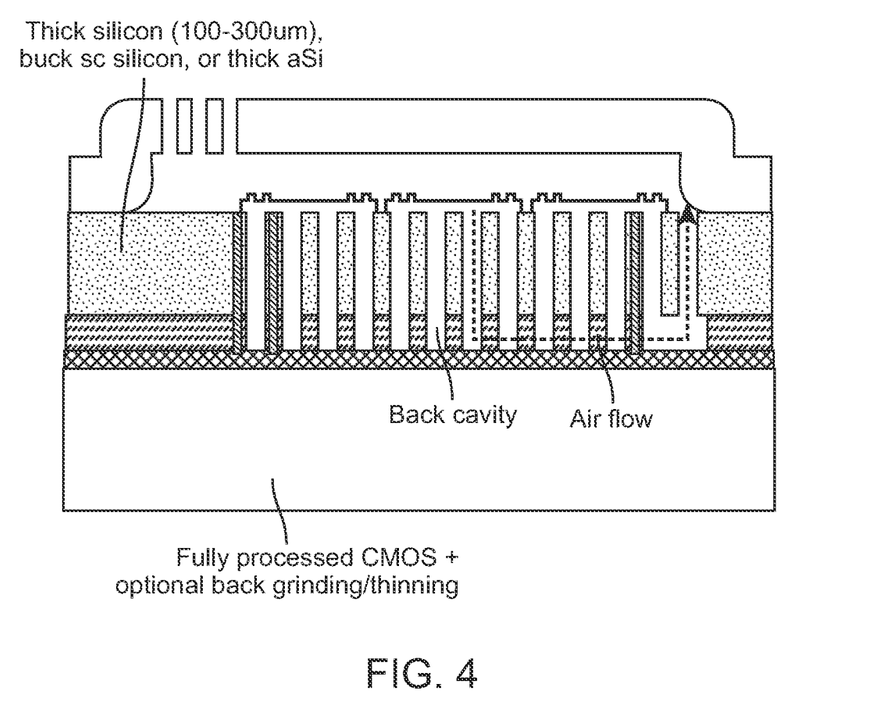
FIG. 4 is a simplified cross section diagram of components of a micromachined microphone according to one embodiment of the present invention.

FIG. 4 is a simplified cross section diagram of components of a micromachined microphone according to one embodiment of the present invention. As depicted, a thick layer of silicon is added on top of the CMOS substrate. Air holes and back cavity are then formed within the silicon layer. The silicon layer can be either layer transferred single crystal silicon or deposited thick amorphous silicon film. Back grind/thinning of the CMOS substrate is optional to reduce the overall thickness of the microphone.

Figure 5:
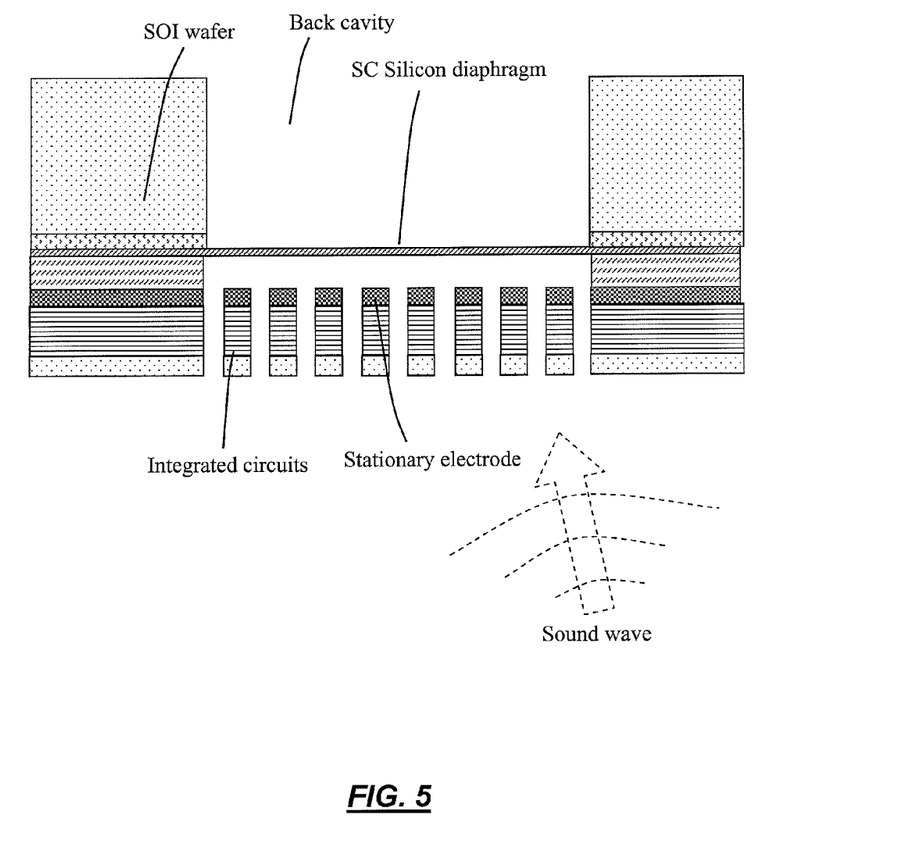
FIG. 5 is a simplified cross section diagram of components of a micromachined microphone according to one embodiment of the present invention.

FIG. 5 is a simplified cross section diagram of components of a micromachined microphone according to one embodiment of the present invention. As depicted, air vent holes are formed through the CMOS layers and partial back silicon in the CMOS substrate. A SOI wafer is then bond to the CMOS substrate. A DRIE etch of the SOI substrate stopping on the BOX forms the back cavity. After removing the BOX, the SOI layer is then released and becomes the diaphragm. Finally, a thinning step of the CMOS substrate expose the air vents which becomes the inlet of the sound wave.

Figure 6:
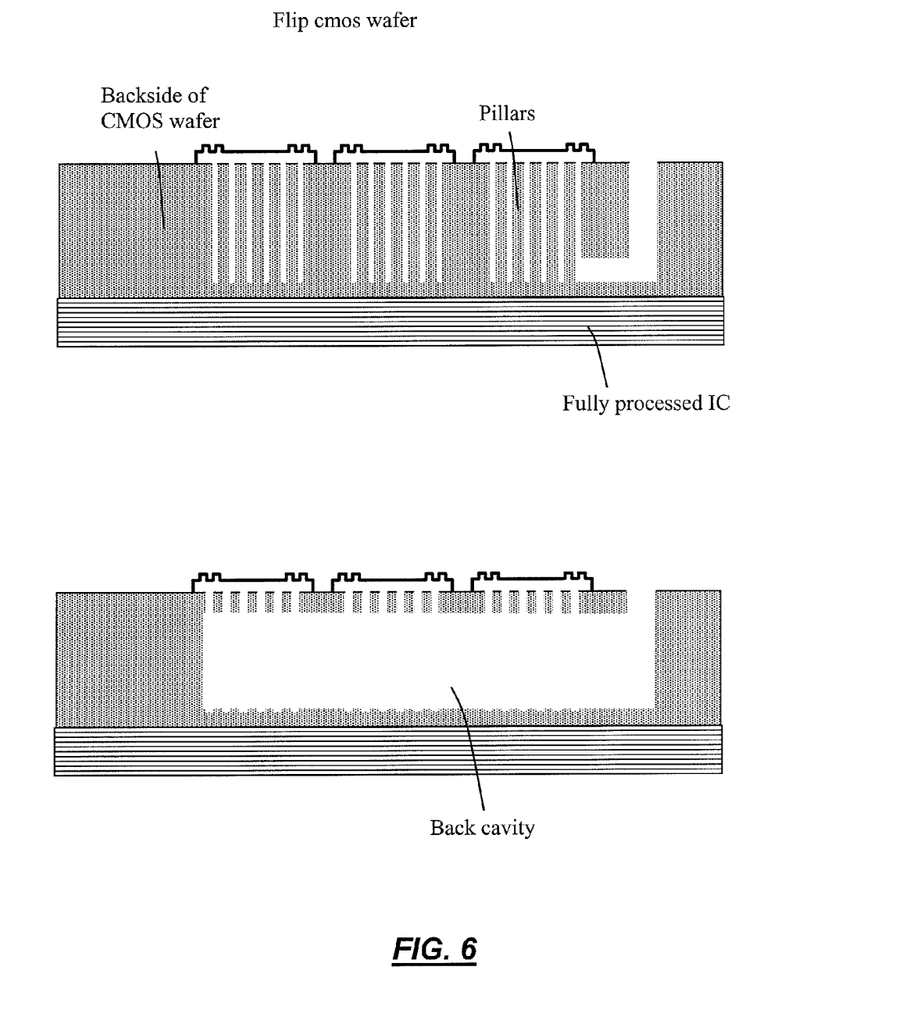
FIG. 6 is a simplified cross section diagram of components of a micromachined microphone according to one embodiment of the present invention.

FIG. 6 is a simplified cross section diagram of components of a micromachined microphone according to one embodiment of the present invention. As depicted, the CMOS substrate is flipped for backside processing after completion. In one embodiment, an array of pillars are DRIE etched into the bulk silicon to form air channels. In another embodiment, an array of air vent holes are DRIE etched to a shallow depth into the bulk silicon followed by an isotropic silicon etch to form back cavity within the bulk silicon.

Figure 7:
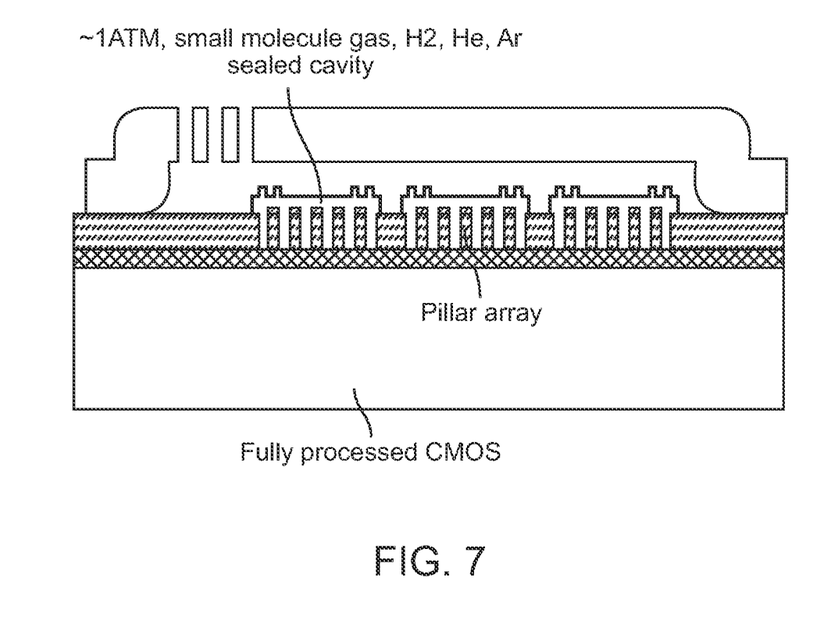
FIG. 7 is a simplified cross section diagram of components of a micromachined microphone according to one embodiment of the present invention.

FIG. 7 is a simplified cross section diagram of components of a micromachined microphone according to one embodiment of the present invention. As depicted, a small molecule gas such as H2, He, or Argon with one atmosphere pressure is sealed in a cavity. The stationary electrode is consisted of an array of pillar structure that allows gas to flow. The small molecule gas eliminates the need of back cavity.

Figure 8:
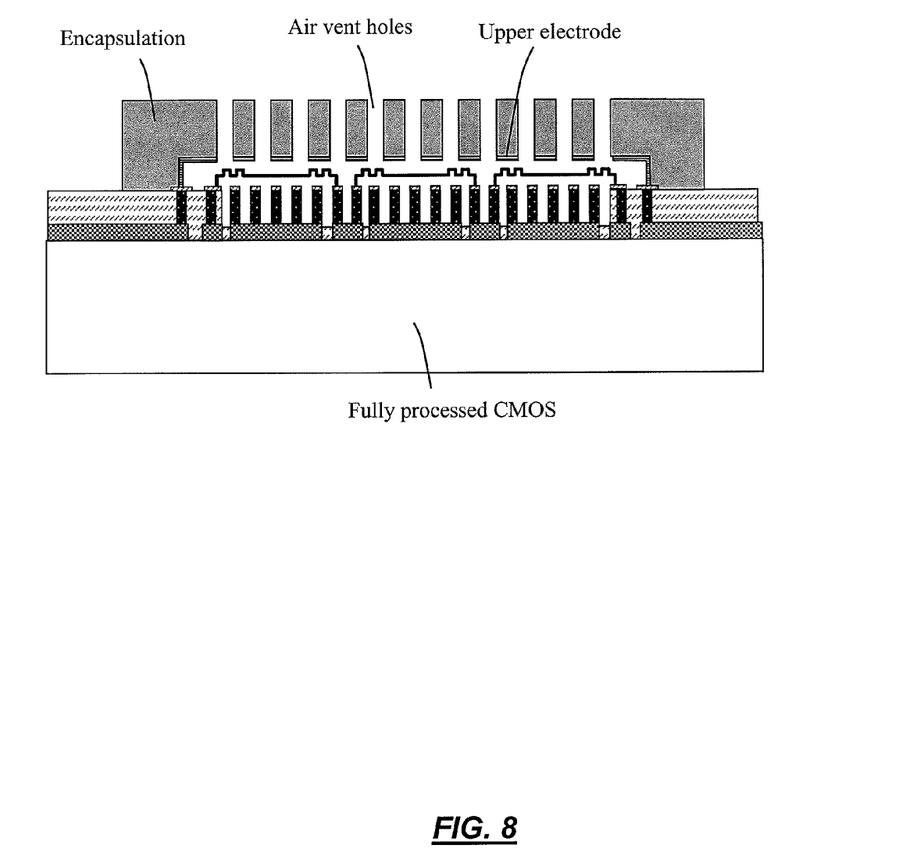
FIG. 8 is a simplified cross section diagram of components of a micromachined microphone according to one embodiment of the present invention.

FIG. 8 is a simplified cross section diagram of components of a micromachined microphone according to one embodiment of the present invention. As depicted, the encapsulation consisted of a thick insulation layer and a conductive layer at the bottom. The bottom conductive layer becomes the upper electrode.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A microphone device comprising:
a substrate having a surface region;
a CMOS integrated circuit device layer overlying the surface region of the substrate;
a diaphragm device having a plurality of surface regions overlying the CMOS integrated circuit device layer, wherein the plurality of surface regions comprises at least one surface region disposed within a center region of the diaphragm and two or more surface regions disposed radially around the center region of the diaphragm, the plurality of surface regions being coupled to the CMOS integrated circuit device layer; and
at least one or more spring devices spatially disposed within a vicinity of the plurality of surface regions of the diaphragm device, each of the spring devices being operably coupled to at least one of the plurality of surface regions of the diaphragm device.

2. The device of claim 1 wherein each of the one or more spring devices comprises one or more folded spring devices having a horizontal compliance and a vertical compliance.

3. The device of claim 1 wherein the one or more spring devices being integrally formed within the plurality of surface regions of the diaphragm device.

4. The device of claim 1 wherein the diaphragm device is characterized by a thickness of about one micron and less.

5. The device of claim 1 wherein the diaphragm device is made of a semiconductor material, a metal material, or a dielectric material or any combination of these.

6. The device of claim 1 wherein the plurality of surface regions comprises an array being defined by N and M, where N and M are integers greater than 2.

7. The device of claim 1 further comprising one or more lower electrodes operably coupled to one or more of the surface regions, the one or more lower electrodes overlying the CMOS integrated circuit device layer, the one or more lower electrodes underlying the diaphragm device.

8. The device of claim 7 further comprising one or more upper electrodes operably coupled to the CMOS integrated circuit device layer, the one or more upper electrodes overlying the diaphragm device to form one or more variable capacitor structures.

9. The device of claim 7 wherein each of the one or more lower electrodes comprises one or more metal regions coupled to one or more of CMOS integrated circuits in the CMOS integrated circuit device layer.

10. The device of claim 7 wherein each of the one or more lower electrodes comprises one or more metal regions overlying an upper dielectric layer provided on the CMOS integrated circuit device layer.

11. The device of claim 7 further comprising one or more vent regions provided adjacent to one or more of the lower electrodes, the one or more of the vent regions extending to a cavity region within a portion of the substrate.

12. The device of claim 1 further comprising a housing member provided overlying the diaphragm device to form an air cavity region between the housing member and the diaphragm device, the housing member comprising one or more air openings to allow air to move between the air cavity and a region outside of the housing member.

13. A microphone device comprising:
a substrate having a surface region;
a CMOS integrated circuit device layer overlying the surface region of the substrate;
a diaphragm device having a plurality of surface regions overlying the CMOS integrated circuit device layer, wherein the plurality of surface regions comprises at least one surface region disposed within a center region of the diaphragm and two or more surface regions disposed radially around the center region of the diaphragm, the plurality of surface regions being coupled to the substrate;
at least one or more folded spring devices spatially disposed within a vicinity of the plurality of surface regions of the diaphragm device, each of the folded spring devices being operably coupled to at least one of the plurality of surface regions of the diaphragm device;
two or more electrode devices operably coupled to each of the plurality of surface regions; and
at least one air channel formed between the two or more electrode devices.

14. The device of claim 13 wherein each of the one or more folded spring devices comprises one or more folded spring devices having a horizontal compliance and a vertical compliance.

15. The device of claim 13 wherein the one or more folded spring devices being integrally formed within the plurality of surface regions of the diaphragm device.

16. The device of claim 13 wherein the diaphragm device is characterized by a thickness of about one micron and less.

17. The device of claim 13 wherein the diaphragm device is made of a semiconductor material, a metal material, or a dielectric material, or any combination of these.

18. The device of claim 13 wherein the plurality of surface regions comprises an array being defined by N and M, where N and M are integers greater than 2.

19. The device of claim 13 further comprising one or more air vent regions provided within a vicinity of the two or more electrode devices.

20. The device of claim 13 further comprising a housing member provided overlying the diaphragm device to form an air cavity region between the housing member and the diaphragm device, the housing member comprising one or more air openings to allow air to move between the air cavity and a region outside of the housing member.

21. The device of claim 13 further comprising:
 a housing member provided overlying the diaphragm device to form an air cavity region between the housing member and the diaphragm device, the housing member comprising one or more air openings to allow air to move between the air cavity and a region outside of the housing member; and
 one or more air vent regions provided within a vicinity of the two or more electrode devices, the one or more vent regions being in fluid communication with the air cavity.

* * * * *